(12) United States Patent
Hull et al.

(10) Patent No.: US 7,701,196 B2
(45) Date of Patent: Apr. 20, 2010

(54) METHODS FOR DETECTING AND CLASSIFYING LOADS ON AC LINES

(75) Inventors: David M. Hull, Adelphi, MD (US); Peter M. Cremona-Simmons, Stafford, VA (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 193 days.

(21) Appl. No.: 11/892,151

(22) Filed: Aug. 20, 2007

(65) Prior Publication Data

US 2008/0048640 A1    Feb. 28, 2008

(51) Int. Cl.
G01R 25/00    (2006.01)
(52) U.S. Cl. .................................... 324/76.77; 324/67
(58) Field of Classification Search ............. 324/76.077
See application file for complete search history.

(56) References Cited

U.S. PATENT DOCUMENTS

| | | | | |
|---|---|---|---|---|
| 4,272,723 | A * | 6/1981 | Pullen ........................ | 324/86 |
| 4,492,918 | A * | 1/1985 | Hernandez et al. ....... | 324/76.77 |
| 6,731,105 | B1 * | 5/2004 | Hoyle et al. ............ | 324/117 R |
| 2001/0010460 | A1 * | 8/2001 | Miller et al. ................... | 324/67 |
| 2003/0128133 | A1 * | 7/2003 | Thomas et al. ........... | 340/854.9 |
| 2005/0246122 | A1 * | 11/2005 | Jones et al. ................. | 702/107 |
| 2006/0009887 | A1 * | 1/2006 | Rubin et al. .................... | 701/9 |
| 2007/0290672 | A1 * | 12/2007 | Worsley et al. ............... | 324/67 |

OTHER PUBLICATIONS

David O. Walsh, Robert T. Kinasewitz, Leon E. Owen, Alexander R. Perry, Peter V. Czipott and T. McManus, "Magnetic/Acoustic Sensor Fusion and Vehicle Tracking Using a Long-Baseline Magnetic/Acoustic Sensor Array," 2004 MSS Specialty Group on Battlefield Acoustic and Magnetic Sensing.

Daniel Roetenberg, Henk Luinge and Peter Veltink, "Inertial and magnetic sensing of human movement near ferromagnetic materials," University of Twente, The Netherlands, Proceedings of the Second IEEE and ACM International Symposium on Mixed and Augmented Reality (ISMAR '03).

J.D. Jackson, "Classical Electrodynamics", section 9.1, pp. 407-410, 4th Ed., Wiley, 1999.

H. Trinks and J.L. ter Haseborg, "Electric Field Detection and Ranging of Aircraft," IEEE Transactions on Aerospace and Electric Systems, vol. AES-18, No. 3, pp. 268-274, May 1982.

* cited by examiner

*Primary Examiner*—Timothy J Dole
*Assistant Examiner*—Benjamin M Baldridge
(74) *Attorney, Agent, or Firm*—Edward L. Stolarun; Alan I. Kalb

(57) ABSTRACT

Methods for detecting and classifying loads on alternating current (AC) lines are provided. One such method includes the steps of placing an AC field sensor in AC electric and magnetic fields generated by an AC line, generating an electric field signal representative of the AC electric field received by the AC field sensor, generating a magnetic field signal representative of the AC magnetic field received by the AC field sensor, generating a relative phase signal representative of relative phase changes between the electric and magnetic fields, and processing the relative phase signal to detect and classify loads on the AC line. In another method, relative load vector signals representative of relative magnitude and phase changes in the magnetic field are generated and processed to detect and classify loads on the AC line.

7 Claims, 10 Drawing Sheets

METHODS FOR DETECTING AND
CLASSIFYING LOADS ON AC LINES

GOVERNMENT INTEREST

The invention described herein may be manufactured, used, and licensed by or for the United States Government.

BACKGROUND

1. Technical Field

The invention relates generally to methods for detecting and classifying loads on alternating current (AC) lines.

2. Description of the Related Art

The prior art teaches various methods for detecting loads on AC lines. For example, the prior art teaches the use of AC magnetic field sensors to detect loads on AC power lines. When a load is connected to an AC power line, electrical current flows through the line to the load. This current generates an AC magnetic field that can be sensed by an AC magnetic field sensor.

Unfortunately, AC magnetic field sensors cannot be used to classify the type of load on an AC power line. In other words, AC magnetic field sensors cannot be used to determine if a load is resistive, inductive or some other type of load. This is true because estimating the type of load requires knowledge of the relative phase of the voltage and current on an AC power line and the relative phase that can typically be measured is a complex function of the size and location of power capacitors, the positioning and spacing of various conductors on utility poles, and the orientation and type of sensors being employed.

SUMMARY

Methods of detecting and classifying loads on AC lines are provided. An exemplary embodiment of one such method comprises: placing an AC field sensor in AC electric and magnetic fields generated by an AC line; generating an electric field signal representative of the AC electric field received by the AC field sensor; generating a magnetic field signal representative of the AC magnetic field received by the AC field sensor; generating a relative phase change signal representative of relative phase changes between the electric and magnetic fields; and processing the relative phase change signal to detect and classify load changes on the AC line.

Another exemplary embodiment comprises: placing an AC field sensor in AC electric and magnetic fields generated by an AC line; generating an electric field signal representative of the AC electric field generated by the AC line; generating a magnetic field signal representative of the AC magnetic field generated by the AC line; generating a relative load vector signal representative of relative magnitude and phase changes of the magnetic field; and processing the relative load vector signal to detect and classify load changes on the AC line.

Other methods, features and/or advantages will be or may become apparent to one with skill in the art upon examination of the following drawings and detailed description. It is intended that all such additional systems, methods, features and/or advantages be included within this description and be protected by the accompanying claims.

BRIEF DESCRIPTION OF THE DRAWINGS

The components in the drawings are not necessarily to scale relative to each other. Like reference numerals designate corresponding parts throughout the several views.

FIG. 8 is a diagram illustrating the change in the relative phase of the electric and magnetic fields when a load is turned on.

DETAILED DESCRIPTION

Figure 1:
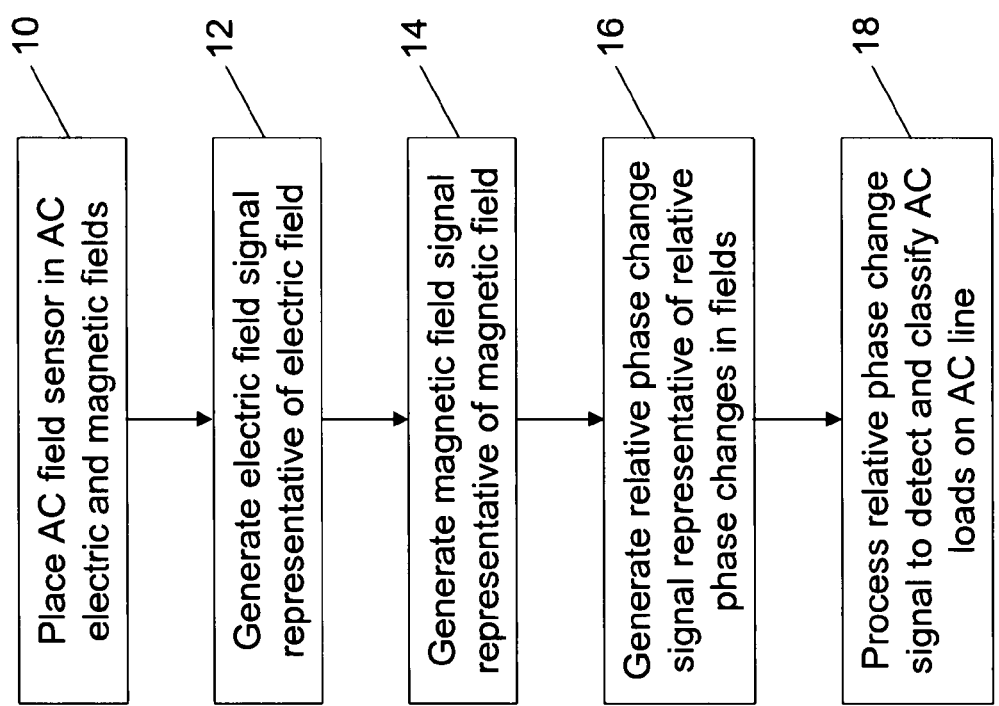
FIG. 1 is a flowchart showing an exemplary embodiment of a method for detecting and classifying loads on alternating current (AC) lines.

Methods for detecting and classifying loads on alternating current (AC) lines are provided. In an exemplary embodiment, one such method (see FIG. 1) includes the steps of placing an AC field sensor in the AC electric and magnetic fields generated by an AC line (block 10); generating an electric field signal representative of the AC electric field received by the AC field sensor (block 12); generating a magnetic field signal representative of the AC magnetic field received by the AC field sensor (block 14); generating a relative phase change signal representative of relative phase changes between the electric and magnetic fields (block 16); and processing the relative phase change signal to detect and classify loads on the AC line (block 18).

The AC field sensor may be a combination AC electric and magnetic field sensor or separate electric and magnetic field sensors. For example, the AC field sensor may be a combination AC electric and magnetic field sensor commercially available from Quasar Federal Systems. Separate electric and magnetic field sensors are also commercially available from Quasar and any one of a variety of different combinations of these sensors may be used as well. The AC field sensor may include quasi-static electric field and magnetic field sensors located on the ground, or on or near buildings or other objects and/or structures that may distort the electric and/or magnetic fields generated by the AC line.

The methods described in this application do not require physical proximity to the equipment being monitored; only physical proximity to the AC lines supplying power to the equipment. In the United States, where AC power lines operate at a frequency of 60 Hz, relatively low cost unattended electric field and magnetic field ground sensors operating within about 500 meters of the power lines can be used to detect the quasi-static electric and magnetic fields generated by these lines. This range may be greater for high-voltage transmission lines in rural environments, and may be less in urban environments, with signal clutter from many other sources.

The AC power line may operate at any commonly used frequencies including, for example, 25, 50, 60, or 400 Hertz (Hz). The voltages and currents on the AC line may be unknown. In addition, the relative phases between the voltage and current on the line may be unknown. Moreover, the relative phase of the sensed electric and magnetic fields at an arbitrary point on the ground may not equal the relative phase of the source voltage and current on the power line. This allows the methods described in this application to be used in ad hoc situations and/or areas where a power company has the right of way.

The AC line may be buried, provided the line still generates detectable AC electric and magnetic fields. The detection range (that is, the distance between the AC power line and the AC field sensor) in these cases, however, will generally be more limited. For example, with overhead power lines, the AC field sensors may be placed tens of meters or more from the AC power lines. In contrast, for underground lines the AC field sensor may be placed much closer to the AC power lines—on the order of meters or less.

Figure 2:
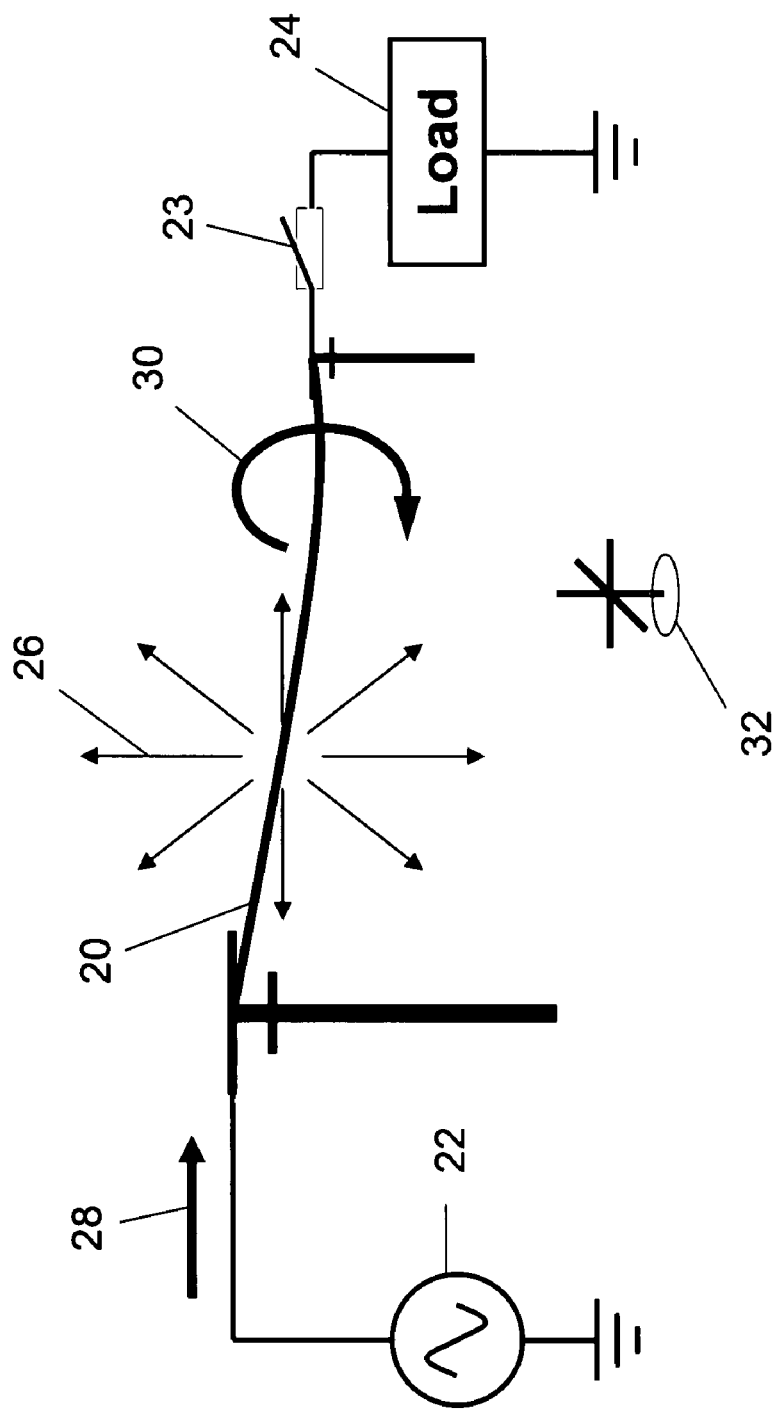
FIG. 2 is a schematic diagram showing an exemplary setup for using the method described in FIG. 1 with a 60 Hertz AC power line.

An exemplary setup for using the methods described in this application with a 60 Hz AC power line 20 is shown in FIG. 2. As shown in the figure, 60 Hz AC power line 20 is driven by a highly-regulated voltage source 22 and connected to a remote load 24 using switch 23. When voltage is applied by source 22, power line 20 generates a quasi-static electric field 26, which is proportional to the voltage on line 20. When load 24 is connected, a current 28 flows from source 22 through power line 20 to load 24. The flow of current 28 causes power line 20 to generate a magnetic field 30, which is proportional to the amount of current 28 flowing through the line and thus the electrical size of load 24.

Both electric field 26 and magnetic field 30 can be sensed by AC field sensor 32, which is a combination AC electric and magnetic field sensor, and used to estimate the electrical characteristics of remote load 24. It should be noted that the methods described in this application do not require detection of the entire 3-D vector electric and magnetic fields generated by power line 20. Instead, detection of one component of each is sufficient, e.g. $E_x$ and $B_x$, etc.

When remote load 24 changes, e.g., load 24 turns on or off or a new piece of equipment is connected to power line 20, current 28 changes as well. This, in turn, causes magnetic field 30 to change. The voltage on power line 20 does not change significantly despite changes in current 28 because of the highly regulated nature of source 22.

Figure 3:
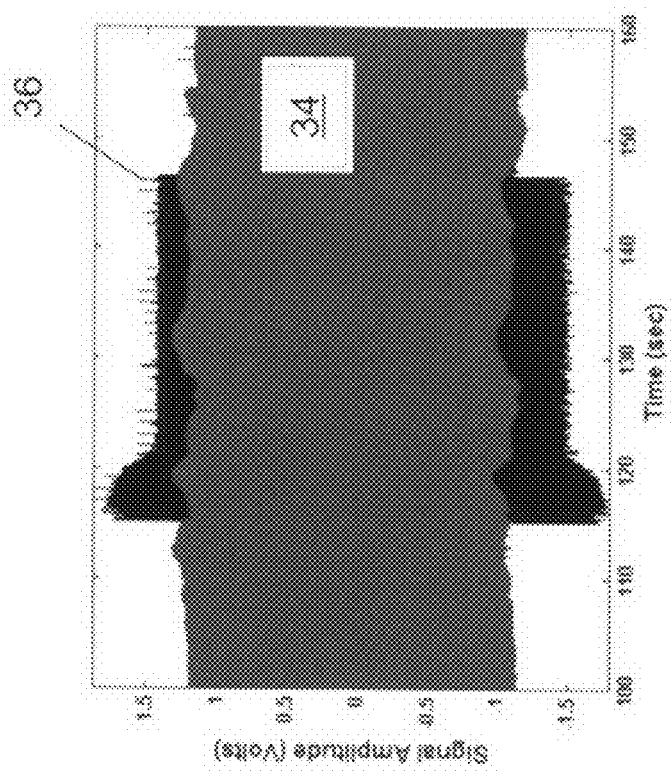
FIG. 3 is plot of the electric and magnetic field signals generated by the AC field sensor shown in FIG. 2 when a fan is turned on and off.

The electric and magnetic field signals generated by sensor 32 may be voltage signals or any other types of signals that can be properly processed to generate a relative phase change signal representative of relative phase changes between the electric and magnetic fields. Examples of the types of voltage signals generated by sensor 32 are shown in FIG. 3. Voltage signal 34 is representative of the electric field signal generated by sensor 32 and voltage signal 36 is representative of the magnetic field generated by sensor 32 when a fan (not shown) is turned on and off on an AC line.

Figure 4:
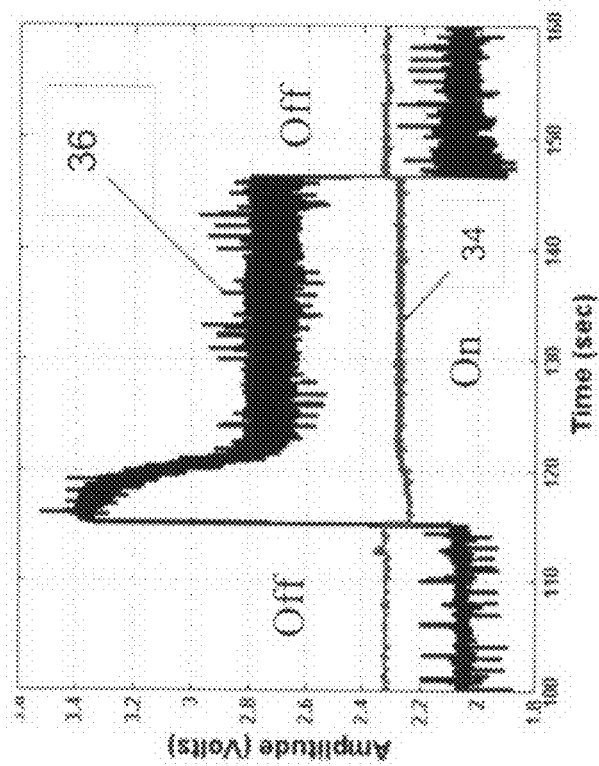
FIG. 4 is a plot of the peak-to-peak envelopes of the electric and magnetic field signals shown in FIG. 3.
Figure 12:
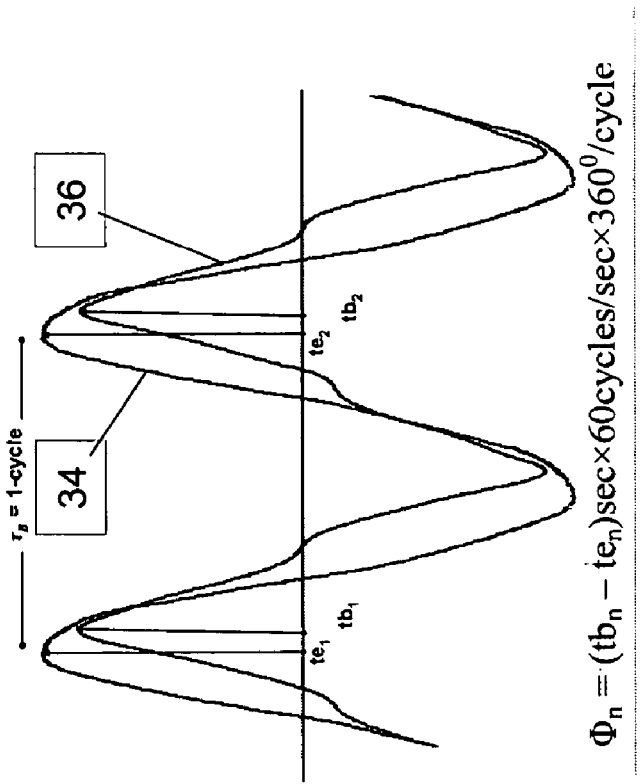
FIG. 12 is a plot showing a portion of the electric and magnetic field signals shown in FIG. 3.

As shown in FIG. 3, voltage signal 34 stays relatively constant when the fan turns on at approximately 115 seconds and off at approximately 147 seconds. In contrast, voltage 36 changes significantly, increasing in amplitude when the fan turns on and decreases in amplitude when fan turns off. The relatively constant nature of signal 34 and the significantly changing nature of signal 36 are better illustrated in FIG. 4, which shows the peak-to-peak envelopes for these signals. FIG. 4 shows the amplitude of the power-line fields only, and does not include the phase information that is required to implement the methods described in this disclosure. In FIG. 4, the two amplitude envelopes 34 and 36 correspond to the two AC voltage waveforms 34 and 36 in FIGS. 3 and 12.

Before turning to the step of generating the relative phase change signal, several observations need to be addressed. First, the phase of the current in AC power lines relative to the phase of the voltage in these lines is dependent on the type of load, e.g., a resistive heater or an inductive motor, on the lines. In a similar manner, the phase of a sensed magnetic field relative to a sensed electric field is dependent on the type of load on the lines. However, the phases of the sensed fields are dependent on the components of the fields being sensed, and on the geometry of the power line, the sensor, and the surrounding environment. Fortunately, the sensed field components are all sinusoidal (or at least approximately sinusoidal for many loads).

As an aside, it should be noted that the electric and magnetic fields may have significant harmonic components, but these may be filtered out with simple band-pass filters. Alternatively, the methods described in this application may be applied to these harmonic frequencies to provide additional information regarding a load.

Second, the relative phase between the electric and magnetic fields is constant for constant operating conditions, and moreover, the relative phase change is independent of which components of the fields are sensed and where the components are sensed. It should be noted, however, that some components may be stronger than others, and so in general, there may be signal-to-noise issues that limit range and/or affect which field components should be used with the methods described in this application.

Figure 8:
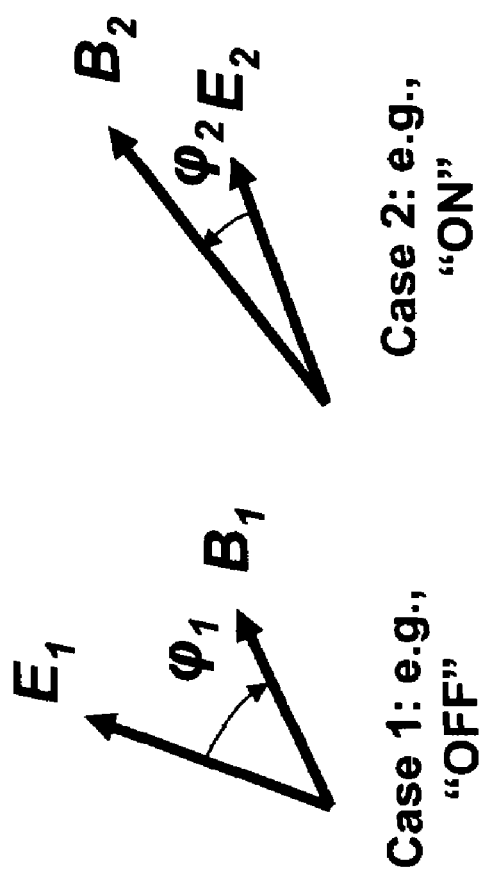

In the simplest case, relative phase detection (RPD) of "on/off" events at distant electrical loads may be determined using only the sensed electric and magnetic fields near the power lines serving the loads by simply determining the change in relative phase of the electric and magnetic fields. This is illustrated graphically in FIG. 8.

The phase (or phase angle) is the computed phase of the electric field (E-field) or the magnetic field (B-field) for a particular frequency component. This is equal to the second component of a complex Fast Fourier Transform (FFT) coefficient corresponding to some frequency (typically, the fundamental frequency of the power line field). It is noted that while the amplitude component is generally constant for constant operation conditions, the phase component will change with changing FFT windows, even for the "same" signal.

The relative phase (angle) is the difference between the computed phases of the E-field and B-field for co-registered electric and magnetic field sensors at the same time: e.g., where the FFTs are taken using the same time window. The relative phase is typically expressed as degrees that the magnetic field is leading (or lagging) the electric field;

$$\Phi = \Phi_B - \Phi_E.$$

Generally, the relative phase will only be meaningful if the quasi-static electric and magnetic fields are correlated; for example, if they are coming from the same source at the same time. The relative phase can be computed for any combination of field components (e.g., $E_x$ and $B_y$), but since it will be different for different components, the specific combination must generally be specified.

The relative phase function is a time-varying signal, determined by computing the relative phase at many different time steps:

$$\phi(t)=\phi_t, t=0, 1, 2, \ldots$$

Alternately, the relative phase may be computed continuously (for example, with analog hardware); in this case, the relative phase function is also continuous.

Simple phase change (or relative phase change or relative phase difference) is the change in relative phase at two different times and typically, for two different operating conditions: for example, "off" and "on". It is noted that this difference is only meaningful for the same field components sensed at the same position. This can be computed from the relative phase function by noting the difference in phase between two relatively steady-state conditions (e.g., at t=1 and t=2):

$$\Delta\phi=\phi(2)-\phi(1)=\phi_2-\phi_1.$$

It is possible to define a simple phase change function with respect to some initial phase condition at t=0:

$$\Delta\phi(t)=\phi(t)-\phi_0,$$

but since $\phi_0$ is a constant (with no special significance regarding the load), it is usually simpler to process $\phi(t)$ instead of $\Delta\phi(t)$.

It is noted that the relative phase $\Delta\phi$ is computed based on field data taken at a particular sensor location and orientation. This relative phase may be different from the relative phase of a similar sensor at a different location. In general, it is also different from the relative phase of different components of the field, or of the relative phase between the current and voltage within the source.

Finally, it is noted that the relative phase can be computed using time-domain techniques that have the benefit of having low computational complexity (that is, low computing "cost"). Alternately, the relative phase can be computed using Short-Time Fourier Transform (or similar) techniques and a time-series of (possibly overlapping) windows. Either way, computing the relative phase at many different time steps creates a relative phase change function; this is a time-varying signal: $\Delta\phi(t)=\phi_t-\phi_0$, where the "starting point" (t=0) can be any convenient point in time.

Figure 5:
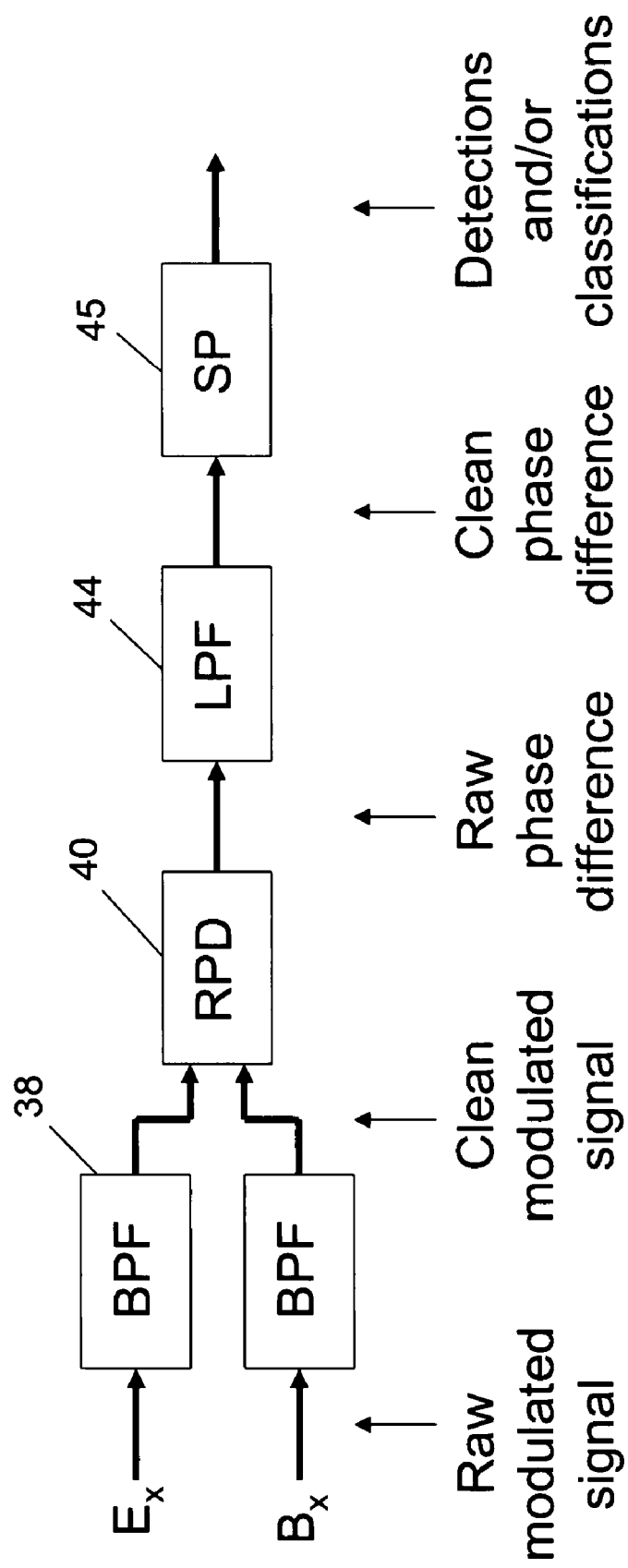
FIG. 5 is a block diagram showing an exemplary embodiment of the steps for processing the electric and magnetic fields in FIG. 3 to detect and classify loads on an AC line using a relative phase change signal.

The step of generating a relative phase change signal may include the steps of filtering signals 34 and 36 with band-pass filters (BPF) 38 to reduce or eliminate harmonics and broadband noise (see FIGS. 3 and 5). Band-pass filters 38 should be centered on the fundamental AC "carrier" frequency of the electric and magnetic fields. For example, if the method is used with a 60 Hz AC power line, a 60 Hz band-pass filter should be used. Band-pass filters 38 may be implemented in hardware using a simple resistive capacitive (RC) circuit (analog BPF).

Electric field and magnetic field signals 34 and 36 (see FIG. 3) may be sampled, typically at 20-200 times the fundamental frequency. The advantage of this over-sampling is that fewer computations are required (e.g., for later interpolation) for accurate differencing during the relative phase detection step discussed below. Alternatively, this sampling step and the relative phase detection step may be implemented in analog hardware with two phase-locked loop (PLL) circuits, followed by a difference amplifier (typically an operational amplifier) and an analog to digital (A/D) sampler (or two A/D samplers and a digital difference operation on a microcontroller). It is even possible to keep all processing in the analog domain. For example, an analog difference amplifier could be followed by an analog circuit that was "tuned" to detect abrupt phase changes, e.g., >1°/ms, sustained for >10 milliseconds.

The phase difference between the electric-field and magnetic-field signatures is determined by a relative phase detection (RPD) circuit or algorithm 40 (FIG. 5). This can be done by: (a) simple (that is, unfiltered) peak finding (of the positive peak), (b) simple peak finding (negative peak), (c) simple zero-crossing detection (positive slope), (d) simple zero-crossing detection (negative slope), (e) an interpolated version of any of the above techniques, or (f) a filtered version of any of the above techniques. An example using the positive peak finding method discussed above is illustrated in FIG. 12. As shown in the equation included with that figure, the relative phase difference between the electric and magnetic fields is calculated by finding the time when the positive peak value of the electric field occurs, finding the time when the positive peak value of the magnetic field occurs, subtracting these two times to obtain a time difference in seconds, and then converting this time difference into degrees. Similar procedures could be employed using the negative peak values for these waveforms or the zero crossing times for these waveforms.

With regard to linear interpolation, the phase of a 50-Hz signal sampled at 1 kilo samples per second (ksps), i.e., every 18 degrees can be estimated by linear interpolation. As a second example, the phase of a 60-Hz signal sampled at 10.8 ksps (i.e., every 2 degrees) can be determined by fitting a line to the 30 points closest to zero on the positive-going slope of the signal (i.e., ±30°). The zero-crossing of this linear regression line is often a very good estimate of the "true" zero-crossing of the AC signal, even in a noisy environment, but the computational cost is greater than for a simple zero-crossing detector. If harmonics exist on the magnetic signature (and typically, they do if BPF 38 does not exist or has not been completely effective in removing the harmonics), then the output of a simple zero-crossing detector may be more noisy than the output of a simple peak detector, so the "best" means of detecting the phase may be different for different applications.

Typically, a phase difference is determined every cycle (e.g., 60 sps for a 60-Hz power line). However, this is not required: for example, if analog phase detection and differencing are used, the difference signal could be sampled at another sampling rate (e.g., 10 or 100 sps). The essential output of this step is a relative phase signal that is sampled at a relatively low rate (typically 60 sps for a 60-Hz power line signal). The bottom line is that this relative phase signal is directly related to state changes of equipment powered by the line (e.g., a motor turning on or off).

Figure 6:
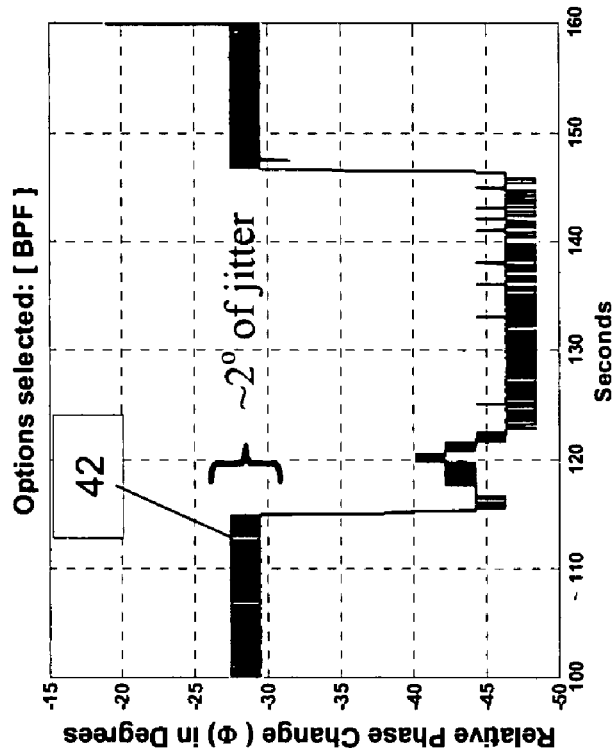
FIG. 6 is a plot of an unfiltered relative phase change signal generated using the processing steps shown in FIG. 5.
Figure 7:
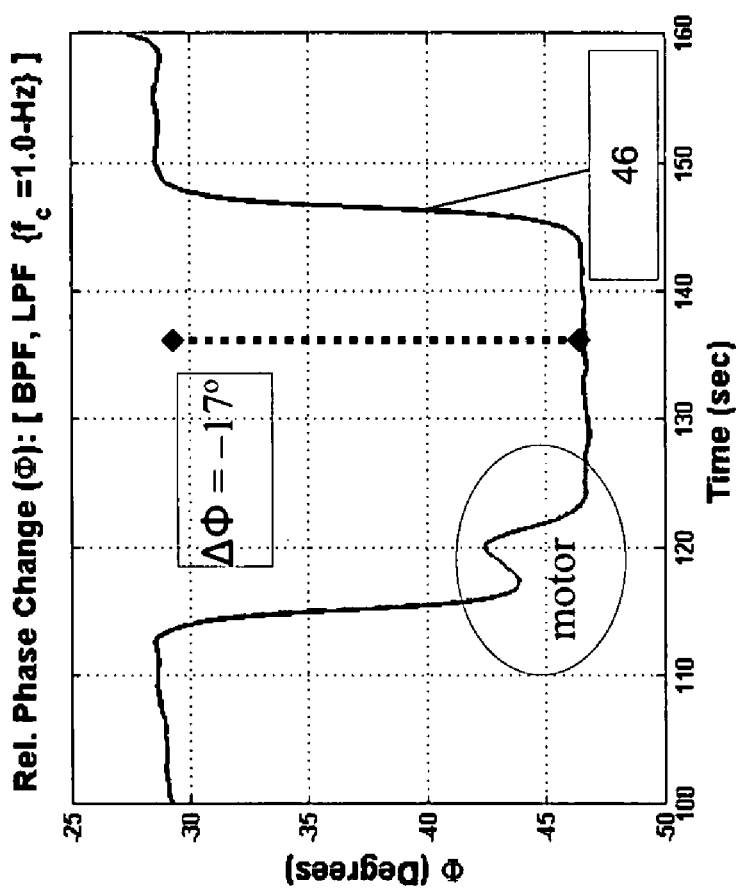
FIG. 7 is a plot of a filtered version of the relative phase change signal shown in FIG. 6.

RPD circuit 40 may be used to generate a raw (or unfiltered) relative phase change signal 42 representative of relative phase changes in the electric and magnetic fields. An example of such a signal is shown in FIG. 6. As shown in this figure, unfiltered relative phase signal 42 may include jitter, noise "spikes" and other spurious "events" that could result in false alarms. These noise spikes and events can be eliminated using a low-pass filter (LPF) 44, which may be a 1-Hz LPF. A relative phase change signal 46 after it has passed through LPF 44 is shown FIG. 7.

LPF 44 may be implemented using a "dumb" microcontroller (that is, a very low-cost and low-power, integer-arithmetic, 8-bit microcontroller, possibly even one without a hardware multiplier). If LPF 44 is implemented in this manner, the relative phase signal can be "smoothed" significantly in the time domain with a simple filter, such as an 8-point running average filter, which requires only 7 adds and one bit-shift operation per sample, or a 5-point median filter, which requires only a few compare operations per sample.

The last step in the method shown in FIG. 1 is the processing of relative phase change signal 46 to detect and/or classify loads, e.g., a motor has been turned on. This step is accomplished using a signal processing circuit 45 (FIG. 5) and can be implemented in a variety of different ways. For example, the signal processing step may be accomplished with simple threshold and/or slope detectors (in either the analog or digital domain), or more advanced (and computationally-expensive) digital signal processing (DSP) techniques commonly used in estimation and detection theory, such as Bayesian filters, matched filters, and Kalman filters.

Figure 10:
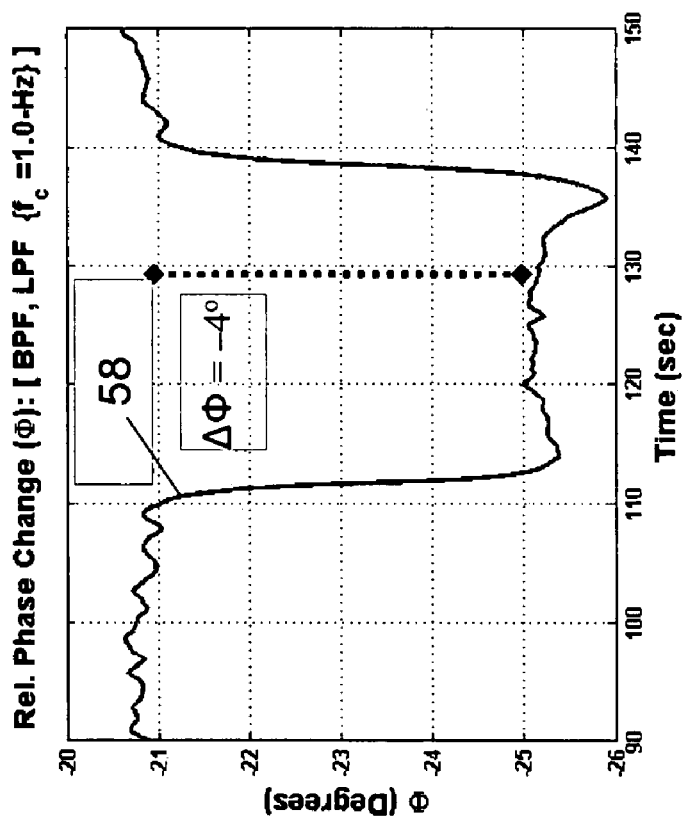
FIG. 10 is a plot showing a relative phase change signal generated when a halogen lamp is turned on and off.

Since the relative phase change is different for different types of loads (see FIG. 7, which shows a relative phase change of −17° when a fan is turn on, and FIG. 10, which shows a relative phase change of −4° when a halogen lamp is turned on), some classification is also possible. A limitation of this (simple) algorithm is that the relative phase change is a function of the initial load (that is, the load before the change) as well as of the change in load. For example, if the load is doubled, no phase change will be detected. As a second example, if the initial load is capacitive (for example, due to a static capacitor on the power-distribution line and a lightly-loaded circuit), and a resistive load is applied, the relative phase change will be negative. But if the initial load is inductive (for example, due to a motor), and the same resistive load is applied, the relative phase change will be positive. As a third example, the relative phase change will be larger when the same load is applied to a lightly-loaded circuit, compared to a heavily-loaded circuit. Nevertheless, if the initial load is known (for example, because of time of day or other "ground truth" data that can be used to infer the initial load), or even if the initial load is consistent, then the relative phase shift will also be consistent.

Figure 9:
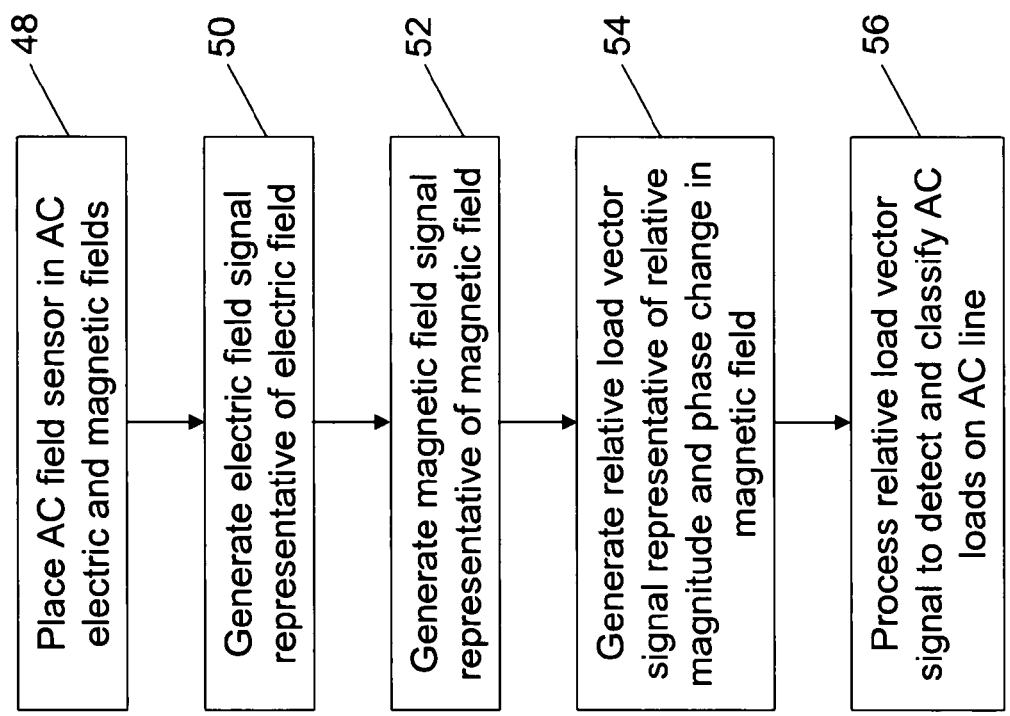
FIG. 9 is a flowchart showing another exemplary embodiment of a method for detecting and classifying loads on AC lines.

In another exemplary embodiment, the method (see FIG. 9) comprises: placing an AC field sensor in the AC electric and magnetic fields generated by an AC line; generating an electric field signal representative of the AC electric field received by the AC field sensor; generating a magnetic field signal representative of the AC magnetic field received by the AC field sensor; generating a relative load vector signal representative of relative magnitude and phase changes in the AC magnetic field; and processing the relative load vector signal to detect and classify loads on the AC line.

Figure 11:
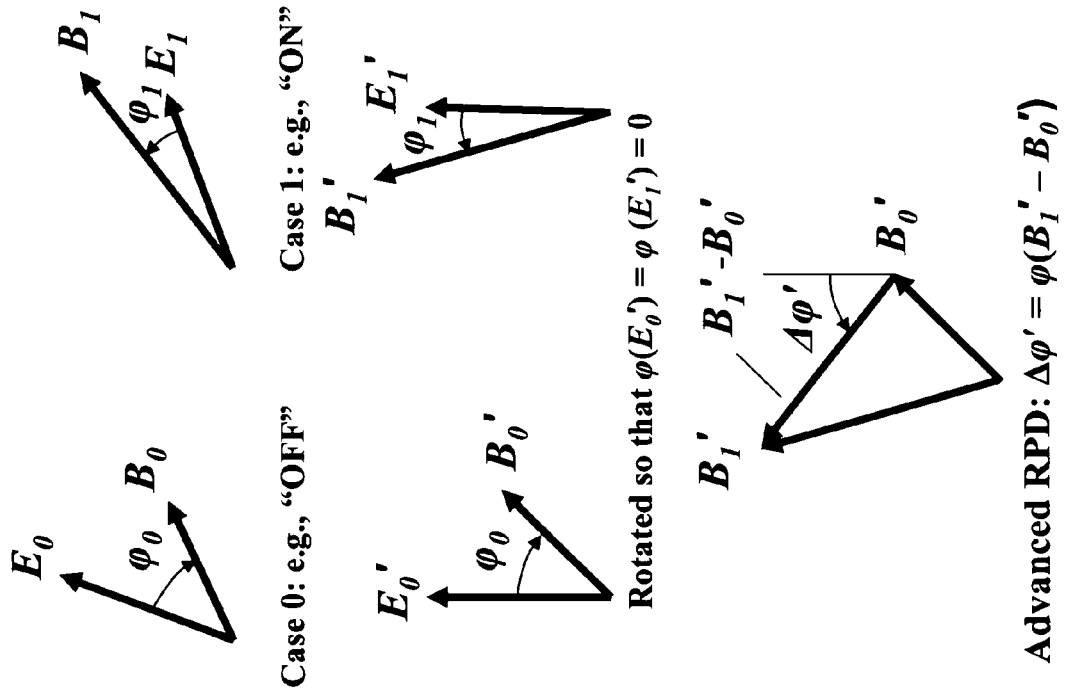
FIG. 11 is a diagram illustrating an exemplary embodiment of the processing steps for generating a relative load vector signal.

This method allows for a more precise characterization of an unknown load change and may be required for particular applications. In these cases, both the relative amplitude change and the relative phase change for the magnetic field are computed as follows. First, the E-field is used to "orient" the magnetic field vector (both magnitude and phase). This rotation (in the E-B space) does not change the relative phase φ. But it allows us to determine the "absolute phase" of the magnetic field vector (in amplitude-phase space). This "absolute phase" does not have any special meaning when computed at a particular point in time, because it is also a function of the geometry of the power line source, the environment, and the sensor orientation. However, it is now meaningful to subtract the magnetic field vectors at two different times, because the vectors have been rotated into the same (mathematical) space. When the subtraction is done, the resulting difference vector has both a magnitude and a phase. This process is illustrated graphically in FIG. 11.

The vector phase change (applies to the advanced algorithm) is the computed phase of a "relative load vector" that changed during the time between $t_1$ and $t_2$:

$$\Delta\phi' = \phi(B_2' - B_1').$$

This is explained in more detail in the description of the vector algorithm in the next section. In this case, the vector phase change function can be defined to be:

$$\Delta\phi'(t) = \phi(B_t' - B_0').$$

In the advanced algorithm, the difference vector $(B_2'-B_1')$ has a magnitude that is proportional to the change in load, and a phase that is equal to the phase of the current flowing to that new load. The advantage of this method over the simple method is that it eliminates the ambiguity that is caused by an unknown initial load.

The vector algorithm can be implemented in much the same way as the simple algorithm, except that the magnetic field amplitude (as a function of time) must also be maintained. Then an extra step is inserted between the relative phase detector step and the low-pass filter step discussed above with regard to the simple method shown in FIG. 1; this step is called the vector load differencer (VLD).

The VLD simply subtracts the rotated magnetic field vector corresponding to the "initial load" (that is, the vector computed at some previous time, $t_0$) from the "current load" vector to determine the "relative load vector" $(B_2'-B_1'$ in the earlier description of the invention). Since the load vectors are typically computed in a magnitude-phase form, it is noted that this vector subtraction requires that $\sin(\phi)$ and $\cos(\phi)$ be calculated, but it is also noted that these functions can be programmed on a simple microcontroller as look-up tables. It is also noted that the LPF and the SP must process both components of the relative load vector (e.g., x and y), but otherwise, the nature of these functions are equivalent to their counterparts in the simple method.

In summary, there are three types of differences that are computed. The first is the relative phase between the electric and magnetic fields at some frequency. This eliminates the ambiguity due to sampling or windowing the data. The second is the simple phase change, which is the change in relative phase at two different times. This eliminates the phase ambiguity due to specific sensor conditions. The third difference is the vector phase change, which is the phase of the change in the load vector. This eliminates the ambiguity due to uncertainty in the initial load.

The vector method allows loads to be characterized with much greater accuracy and can still be implemented on a very low-cost microcontroller, e.g. an 8-bit, fixed point microcontroller). The vector method can be used to easily monitor electrical loads at a building or site in real time from a single point near the path where electric power is provided. This application is useful for energy management purposes in "smart homes" and may be used by power companies or third party consultants to rapidly characterize the various loads in a home or business, possibly without even entering the premises.

The methods described herein may be used to: 1) detect that a load on an AC power line has changed, e.g., that a piece of equipment powered by the line has been turned on or off; 2) estimate the type of load on an AC power line, e.g., resistive, inductive, or some other type of load; and/or 3) estimate other electrical characteristics of a load based on start-up transients, harmonics, and other similar types of operating conditions.

The methods are computationally-efficient (relative to FFT-based methods) and can be implemented on relatively low-cost and low-power microcontrollers using fixed-point (integer) arithmetic. That is, no multiplication or "expensive" operations like square-root are required, and no floating-point variables or mathematical operations are required.

It should be emphasized that many variations and modifications may be made to the above-described embodiments. All such modifications and variations are intended to be included herein within the scope of this disclosure and protected by the following claims.

What is claimed is:

1. A method of detecting and classifying loads on an alternating current (AC) power line, comprising the steps of:
    placing an AC field sensor in AC electric and magnetic fields generated by the AC power line, wherein the AC field sensor is not in direct physical contact with the AC power line;
    generating an electric field signal representative of a vector component of the AC electric field received by the AC field sensor;
    generating a magnetic field signal representative of a vector component of the AC magnetic field received by the AC field sensor;
    generating a relative phase change signal representative of relative phase changes in the AC electric and magnetic fields; and
    processing the relative phase change signal to detect and classify loads on the AC power line by remote sensing,
    wherein the step of generating a relative phase change signal comprises generating the relative phase change signal using a Fast Fourier Transform technique.

2. The method of claim 1, wherein the placing step comprises placing a combination AC electric and magnetic sensor in the AC electric and magnetic fields.

3. The method of claim 1, wherein the electric field and magnetic field signals are voltage signals.

4. A method of detecting and classifying loads on an alternating current (AC) power line, comprising the steps of:
    placing an AC field sensor in AC electric and magnetic fields generated by the AC power line, wherein the AC field sensor is not in direct physical contact with the AC power line;
    generating an electric field signal representative of a vector component of the AC electric field generated by the AC line;
    generating a magnetic field signal representative of a vector component of the AC magnetic field generated by the AC line;
    generating a relative load vector signal representative of relative magnitude and phase changes in the magnetic field; and
    processing the relative load vector change signal to detect and classify loads,
    wherein the processing step comprises:
    rotating an initial load vector at an initial time $t_0$ to a common reference point;
    rotating a second load vector at a later time t to the common reference point; and
    subtracting the second load vector from the initial load vector.

5. The method of claim 4, wherein the AC line comprises an AC power line having a frequency of 25, 50, 60, or 400 Hertz.

6. The method of claim 4, wherein the AC power line comprises an AC power line buried in the ground.

7. The method of claim 4, wherein the placing step comprises placing the AC field sensor near a structure that distorts the electric and magnetic fields generated by the AC line.

* * * * *